United States Patent [19]

Egami

[11] 4,188,586
[45] Feb. 12, 1980

[54] DEMODULATOR CIRCUIT FOR CHOPPER AMPLIFIER

[75] Inventor: Tsuneyuki Egami, Okazaki, Japan

[73] Assignee: Nippon Soken, Inc., Nishio, Japan

[21] Appl. No.: 932,292

[22] Filed: Aug. 8, 1978

[30] Foreign Application Priority Data

Aug. 23, 1977 [JP] Japan ................................ 52/100884

[51] Int. Cl.² ...................... G01R 19/18; H02M 7/06; H03D 1/10
[52] U.S. Cl. .................................... 329/192; 324/118; 324/119; 329/205 R; 329/206; 330/10; 363/45
[58] Field of Search ........... 329/179, 192, 203, 205 R, 329/206; 330/10; 325/477, 480, 487; 363/45, 46; 324/118, 119

[56] References Cited

U.S. PATENT DOCUMENTS

| | | | |
|---|---|---|---|
| 3,721,891 | 3/1973 | Moses | 307/267 X |
| 3,787,755 | 1/1974 | Goldner | 324/119 X |
| 4,067,233 | 1/1978 | Obayashi et al. | 73/116 |

Primary Examiner—Siegfried H. Grimm
Assistant Examiner—Edward P. Westin
Attorney, Agent, or Firm—Cushman, Darby & Cushman

[57] ABSTRACT

In a demodulator circuit for a chopper amplifier including a rectifier and a smoothing filter having a capacitor, an impedance conversion circuit is connected to the output side terminal of the capacitor to ensure holding of the stored charges of the capacitor at each negative half-cycle of the amplitude-modulated AC signal applied to the demodulator circuit. A discharge circuit including a switching element is further provided for the capacitor and the discharge circuit is rendered conductive at each positive half-cycle of the amplitude-modulated AC signal which is also applied to a control terminal of the switching element.

1 Claim, 3 Drawing Figures

AC AMPLIFIER

DEMODULATOR CIRCUIT FOR CHOPPER AMPLIFIER

BACKGROUND OF THE INVENTION

1. Field of the Invention

The present invention relates to demodulator circuits of the type which demodulate an amplitude-modulated signal to produce an analog voltage signal, and more particularly the invention relates to a demodulator circuit whereby when the output AC voltage signal of a chopper amplifier is converted to a DC voltage signal, the AC component contained in the DC voltage signal is reduced.

2. Description of the Prior Art

A prior art demodulator circuit such as disclosed in U.S. Pat. No. 4,067,233 for converting the output AC voltage signal of a chopper amplifier to a DC voltage signal, is constructed as shown in FIG. 1 of the accompanying drawings. In the Figure, numeral 1 designates a chopper, A an analog signal input terminal of the chopper, B an input terminal for receiving chopper clocks which determine the chopping frequency of the analog signal, 2 an AC amplifier connected to the output terminal of the chopper 1 and comprising an operational amplifier 21, an input capacitor 22, an input resistor 23 and a feedback resistor 24, and C the output terminal of the AC amplifier 2. In the demodulator circuit, numeral 3 designates a rectifying diode of the polarity shown, which is connected to the output terminal C to detect the positive half-cycles of the output signal of the AC amplifier 2. Numerals 4 and 5 designate a resistor and a capacitor constituting a smoothing filter for smoothing the output signal of the diode 3. Symbol D designates an output terminal of the demodulator circuit, and R a load resistor connected to the output terminal D.

The prior art circuit constructed as described above has the following contradictory disadvantages. When the analog voltage signal is chopped by such chopper clocks as shown in (a) of FIG. 2, the AC voltage signal of the AC amplifier 2 takes the form of the output signal shown in (b) of FIG. 2. In response to the positive half-cycle of this output signal, the diode 3 is rendered conductive so that the capacitor 5 is charged with a time constant which is determined by the resistor 4 and the capacitor 5, whereas in response to the negative half-cycle of the output signal, the diode 3 is rendered nonconductive so that the charge stored in the capacitor 5 is discharged through the load register R. Consequently, there is a disadvantage that the AC component $V_R$ shown in (c) of FIG. 2 remains as a ripple at the output terminal D, thus failing to effect demodulation with a high degree of accuracy. As a result, to overcome this disadvantage, if the value of the load resistor R is increased to increase the discharge time constant, there is the following disadvantage. When the peak voltage of the AC voltage signal from the AC amplifier 2 becomes lower than the terminal voltage of the capacitor 5, the diode 3 is rendered nonconductive so that the charge stored in the capacitor 5 is discharged with a time constant determined by the resistor R and the capacitor 5. However, due to the increased time constant, the discharge cannot satisfactorily follow up the output of the AC amplifier 2 thus greatly deteriorating the response.

SUMMARY OF THE INVENTION

With a view to overcoming the foregoing deficiencies, it is the object of the present invention to provide a demodulator circuit having an improved response and capable of effecting demodulation with improved accuracy to decrease the ripple in the converted DC voltage signal.

In accordance with the invention, there is thus provided a demodulator circuit comprising a switching circuit including a resistor and a switching device and an impedance conversion circuit in addition to the prior art demodulator circuit comprising a rectifying circuit and a smoothing circuit consisting of a resistor and a capacitor, and thus the demodulator circuit of this invention has a great advantage that a satisfactory response as well as a great reduction in the ripple contained in the demodulated DC voltage are ensured, thus ensuring the demodulation of an amplitude-modulated signal with a high degree of accuracy.

DESCRIPTION OF THE PREFERRED EMBODIMENT

The present invention will now be described in greater detail with reference to the illustrated embodiment.

Figure 1:
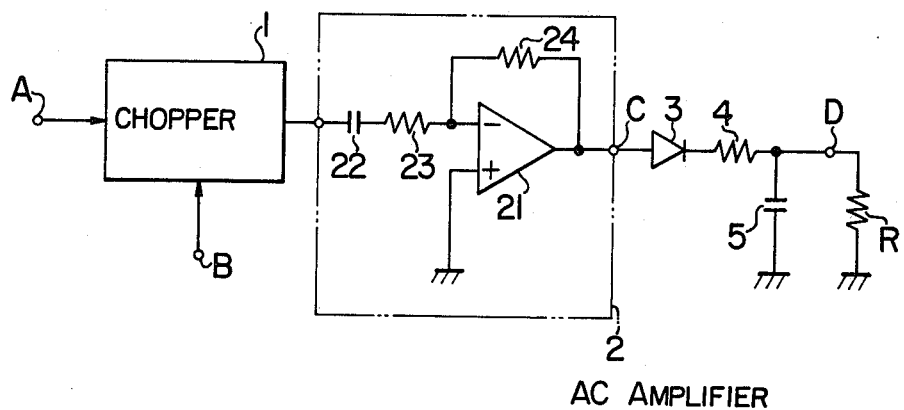
FIG. 1 is a wiring diagram of a prior art demodulator circuit for chopper amplifiers.
Figure 2:
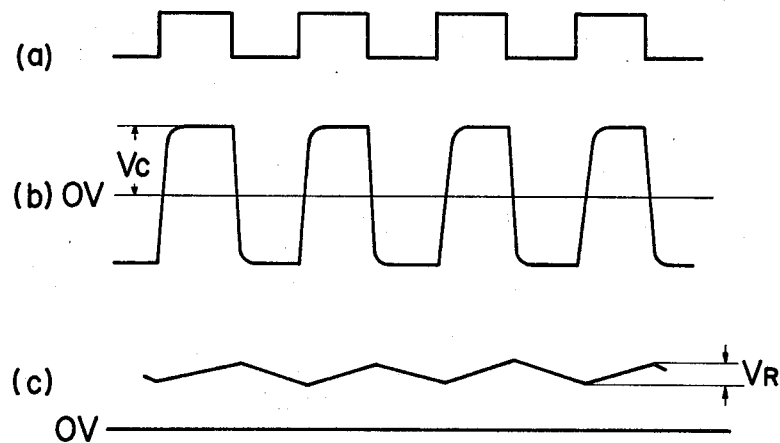
FIG. 2 is a diagram showing signal waveforms generated at various points in the prior art circuitry shown in FIG. 1.
Figure 3:
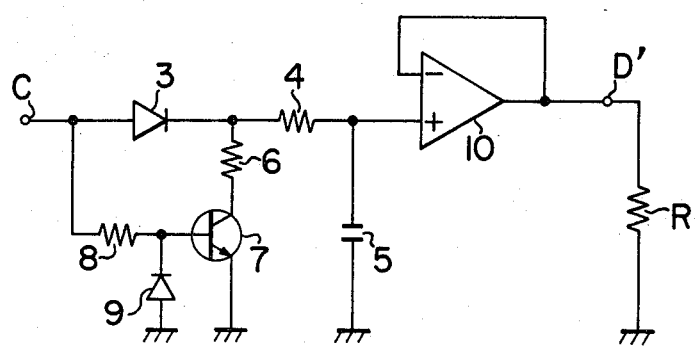
FIG. 3 is a wiring diagram showing an embodiment of a demodulator circuit according to the present invention.

Referring now to FIG. 3, there is illustrated a circuit diagram showing an embodiment of the invention which is an improved form of the known demodulator circuit connected to the output of the AC amplifier 2 in FIG. 1. In FIG. 3, symbol C designates an input terminal for receiving such AC voltage signal as shown in (b) of FIG. 2, and 3 a diode constituting a rectifying circuit of the polarity shown having its one terminal or anode connected to the input terminal C. Numerals 4 and 5 designate a resistor and a capacitor, and this series circuit constitutes a smoothing filter connected to the cathode of the diode 3. A resistor 6, an NPN transistor 7, a resistor 8 and a diode 9 of the polarity shown constitute a switching circuit in which a series circuit comprising the resistor 6 and the transistor 7 is connected between the junction of the diode 3 and the resistor 4 and the ground. The base of the transistor 7 is connected to one end of the resistor 8 whose the other end is connected to the input terminal C. Numeral 10 designates an operational amplifier having two inputs the noninverting input terminal of which is connected to the junction of the resistor 4 and the capacitor 5 and the inverting input terminal of which is connected to an output terminal of the amplifier 10 thus causing it to serve as a voltage follower. Symbol D' designates an output terminal of the demodulator circuit connected to a load resistor R.

With the construction described above, the demodulator circuit of this invention operates as follows. During the positive half-cycle of an AC voltage signal ((b) in FIG. 2) or amplitude-modulated signal received through the input terminal C, the diode 3 is rendered conductive and consequently the capacitor 5 is charged by a charging current flowing to the capacitor 5 through the resistor 4 with the time constant determined by the resistor 4 and the capacitor 5. At this time, the AC voltage signal received through the input terminal C is applied to the base of the transistor 7 through the resistor 8, and consequently the collector-emitter path of the transistor 7 becomes conductive. During the negative half-cycle of the AC voltage signal, both the diode 3 and the transistor 7 are rendered nonconductive and the output is delivered through the operational amplifier 10 serving as an impedance converter having a high input impedance, thus eliminating leakage and ensuring holding of the charge stored in the capacitor 5.

When the peak value of the AC voltage signal applied through the input terminal C decreases, the diode 3 is reverse biased and rendered nonconductive due to the voltage developed across the capacitor 5. However, since the transistor 7 is turned on during the positive half-cycle of the AC input voltage, the charge stored in the capacitor 5 is discharged through the resistors 4 and 6 and the transistor 7 with the time constant determined by the resistors 4 and 6 and the capacitor 5, and consequently the terminal voltage of the capacitor 5 follows up the previously mentioned peak value of the AC input voltage. Thus, a DC voltage signal containing practically no ripple is produced at the output terminal D'.

We claim:
1. A demodulator circuit for a chopper amplifier comprising:
   a rectifier having an input terminal to receive an amplitude-modulated AC voltage signal,
   a smoothing circuit connected to said rectifier and having a serially connected resistor and a capacitor,
   said rectifier having a polarity to charge said capacitor during positive half-cycles of said amplitude-modulated AC voltage signal applied thereto,
   an operational amplifier having a noninverting input terminal connected to a junction between the resistor and capacitor of said smoothing circuit, an inverting input terminal of said operational amplifier being connected to an output terminal thereof, and
   a discharge circuit for the capacitor of said smoothing circuit connected to a junction between said rectifier and said smoothing circuit, said discharge circuit including a serially connected resistor and switching transistor, a base of said switching transistor being connected to the input terminal of said rectifier whereby to render said transistor conductive at each positive half-cycle of the amplitude-modulated AC voltage signal applied thereto.

* * * * *

UNITED STATES PATENT AND TRADEMARK OFFICE
CERTIFICATE OF CORRECTION

PATENT NO. : 4,188,586
DATED : February 12, 1980
INVENTOR(S) : T. EGAMI et al

It is certified that error appears in the above—identified patent and that said Letters Patent is hereby corrected as shown below:

In The Heading:

Please add:

[75] --Hisasi KAWAI, Toyohashi, Japan --

Signed and Sealed this

First Day of July 1980

[SEAL]

Attest:

SIDNEY A. DIAMOND

Attesting Officer

Commissioner of Patents and Trademarks